(12) United States Patent
Ishigaki et al.

(10) Patent No.: US 7,385,380 B2
(45) Date of Patent: Jun. 10, 2008

(54) SWITCHING POWER SUPPLY

(75) Inventors: Takuya Ishigaki, Hitachi (JP); Takashi Sase, Hitachi (JP); Akihiko Kanouda, Hitachinaka (JP); Koji Tateno, Takasaki (JP); Ryotaro Kudo, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/621,664

(22) Filed: Jan. 10, 2007

(65) Prior Publication Data
US 2007/0262761 A1    Nov. 15, 2007

(30) Foreign Application Priority Data
Jan. 11, 2006 (JP) .............. 2006-003765

(51) Int. Cl.
*G05F 1/575* (2006.01)
*G05F 1/618* (2006.01)

(52) U.S. Cl. ...................... 323/285; 323/277

(58) Field of Classification Search ........ 323/222–225, 323/271, 277, 282, 284, 285, 351
See application file for complete search history.

(56) References Cited

U.S. PATENT DOCUMENTS

| | | | |
|---|---|---|---|
| 6,573,693 B2* | 6/2003 | Okamoto | 323/273 |
| 6,995,483 B2* | 2/2006 | Kohout et al. | 307/151 |
| 7,102,337 B2* | 9/2006 | Wheeler et al. | 323/282 |
| 7,151,361 B2* | 12/2006 | Xi | 323/222 |
| 7,180,278 B2* | 2/2007 | Tai et al. | 323/280 |
| 2006/0113979 A1* | 6/2006 | Ishigaki et al. | 323/282 |

FOREIGN PATENT DOCUMENTS

| | | |
|---|---|---|
| JP | 2003-232816 | 8/2003 |
| JP | 2006-158067 | 6/2006 |

\* cited by examiner

*Primary Examiner*—Gary L Laxton
(74) *Attorney, Agent, or Firm*—Antonelli, Terry, Stout & Kraus, LLP.

(57) ABSTRACT

In a switching power supply apparatus for performing a switching control of a power MOS transistor that flows current to a coil and converting input voltage into output voltage, even if there occurs offset voltage in a current sensing operational amplifier, source potential of a current sensing MOS transistor is precisely kept at source potential of a low side power MOS transistor. For example, an offset cancel capacitor is arranged at an inverting input terminal of the current sensing operational amplifier, and voltage in the direction to offset the offset voltage occurring in the operational amplifier is charged to this capacitor.

10 Claims, 13 Drawing Sheets

SWITCHING POWER SUPPLY

CROSS-REFERENCE TO RELATED APPLICATION

The present application claims priority from Japanese Patent Application No. JP 2006-003765 filed on Jan. 11, 2006, the content of which is hereby incorporated by reference into this application.

TECHNICAL FIELD OF THE INVENTION

The present invention relates to an art of a power supply apparatus for generating DC voltage, more specifically to an art effective when applied to a current sensing circuit of a switching power supply apparatus that performs switching control by for example PWM (Pulse Width Modulation) method and converts input voltage and obtains output voltage, in current sensing in a switching regulator.

BACKGROUND OF THE INVENTION

In recent years, many electronic apparatuses have a microprocessor (hereinafter, referred to as CPU) as a system controller. Further, the operating frequency of the CPU has become higher, and as the operating frequency is increasing, so the maximum operating current is increasing.

Under such circumstances, in order to meet the requirement for this large current, there is proposed a multiple phase power supply system where the current supply performance has been increased by connecting plural switching power supplies in parallel. In such a power supply system, if the currents flowing in respective power supplies (phases) are not uniform, heat generation concentrates and causes destruction of the power supply system. It is necessary to precisely detect currents flowing in coils and perform a feedback control of drive signals of power transistors of respective phases so that uniform current should flow to the respective phases. In current sensing for the feedback control, high precision is required for controlling currents of the respective phases evenly.

As a method of detecting current, there is for example one described in Japanese Patent Application Laid-open Publication No. 2003-232816 (Patent Document 1).

Meanwhile, the Patent Document 1 does not take into consideration the case to be used in a switching power supply, further, it does not mention about influences of detection errors due to offset of an operational amplifier of sensing current, and both positive and negative power supplies are required for the operational amplifier.

SUMMARY OF THE INVENTION

Accordingly, an object of the present invention is to provide a switching power supply apparatus that can precisely detect current, without being subject to influences of offset of a operational amplifier for current sensing, and further can make the operational amplifier for current sensing structured of a single power supply, and thereby can attain a highly precise and high speed current control.

The above and other objects and novel features, and advantages of the present invention will be better understood by reference to the following detailed description and in connection with the accompanying drawings.

The outline of a representative one of the inventions to be disclosed in the present application is briefly explained as below.

That is, in order to achieve the above object, according to one aspect of the present invention, in a power supply driver circuit that structures a switching power supply apparatus that switches and controls a power MOS transistor as a power semiconductor element for flowing current to coil as an inductor by PWM method and converts input voltage (increases or decreases voltage) and obtains output voltage, even when offset voltage around ± several mV occurs in a single power supply operational amplifier of a current sensing circuit, source potential or emitter voltage of a current densing MOS transistor is precisely kept at source potential or emitter voltage of low side power MOS transistor.

For example, an offset cancel capacitor is arranged at an inverting input terminal of the current sensing single power supply operational amplifier, and voltage of the direction to cancel offset voltage occurring in the single power supply operational amplifier is charged to the capacitor.

According to the method, since the influences due to offset voltage of the single power supply operational amplifier can be avoided, the source potential or the emitter voltage of a current sensing MOS transistor can be precisely kept at the source potential or the emitter voltage of the low side power MOS transistor, and accordingly, with regard to the source potential or the emitter voltage of the current sensing MOS transistor, the potential does not change by the offset voltage of the current sensing operational amplifier like in the prior art, and the current sensing precision is improved to a switching power supply apparatus and a power supply driver circuit and the output current of a module.

In concrete, in the case when a switching power supply apparatus operates at output current 10A per one phase and the ON resistance of the low side power MOS transistor is 2 mΩ, if offset voltage of ±5 mV occurs in the current sensing operational amplifier, an error of sensing current around ±25% occurs by the offset voltage.

Effects to be obtained by a representative one of the inventions to be disclosed in the present application are briefly explained as below.

That is, according to the present invention, the influence of displacement of virtual ground potential due to offset of the current sensing operational amplifier is controlled, it is possible to realize a switching power supply apparatus that can precisely detect current, without being subject to influences of offset of a operational amplifier for current sensing, and further can make the operational amplifier for current sensing structured of a single power source, and thereby can attain a highly precise and high speed current control.

BRIEF DESCRIPTIONS OF THE DRAWINGS

Figure 14:
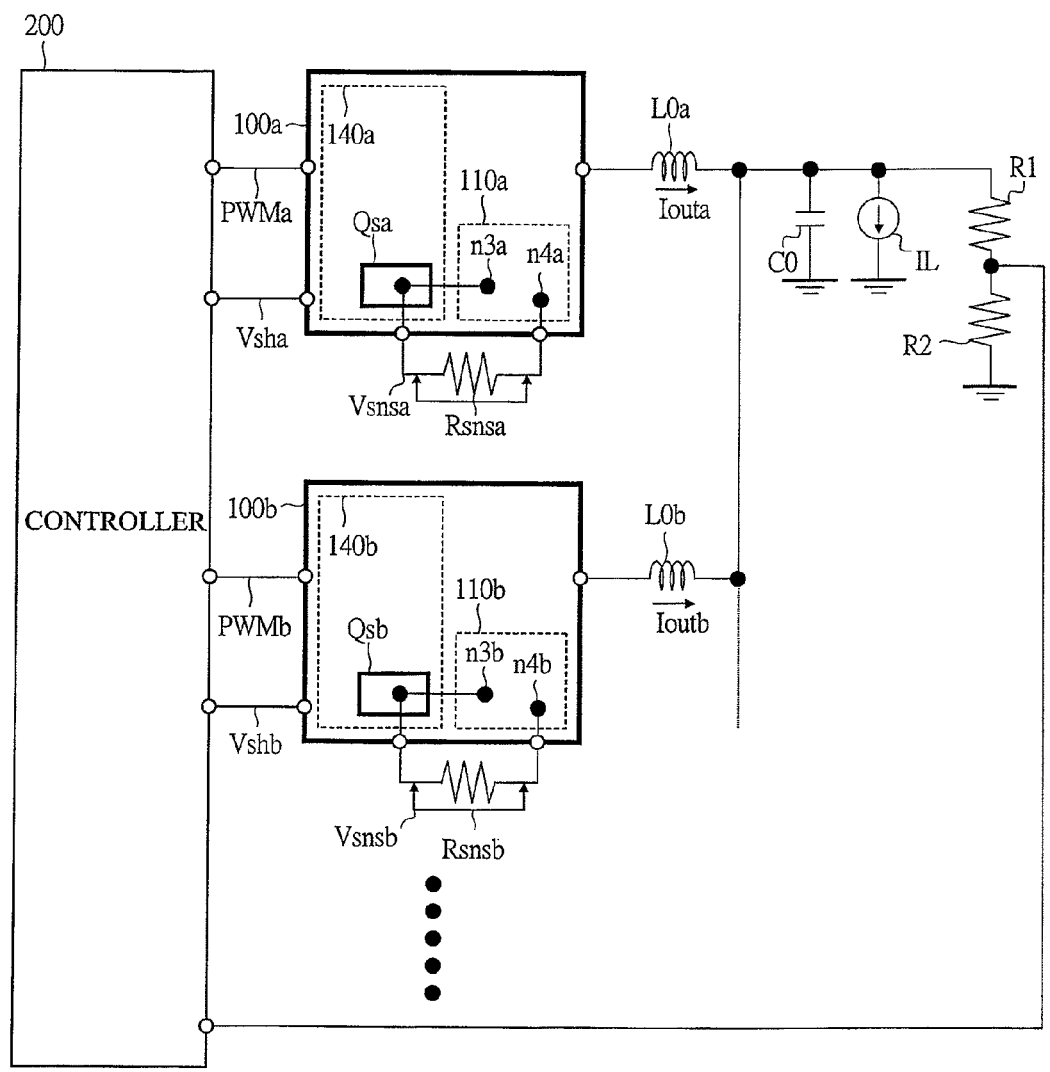
Figure 15:
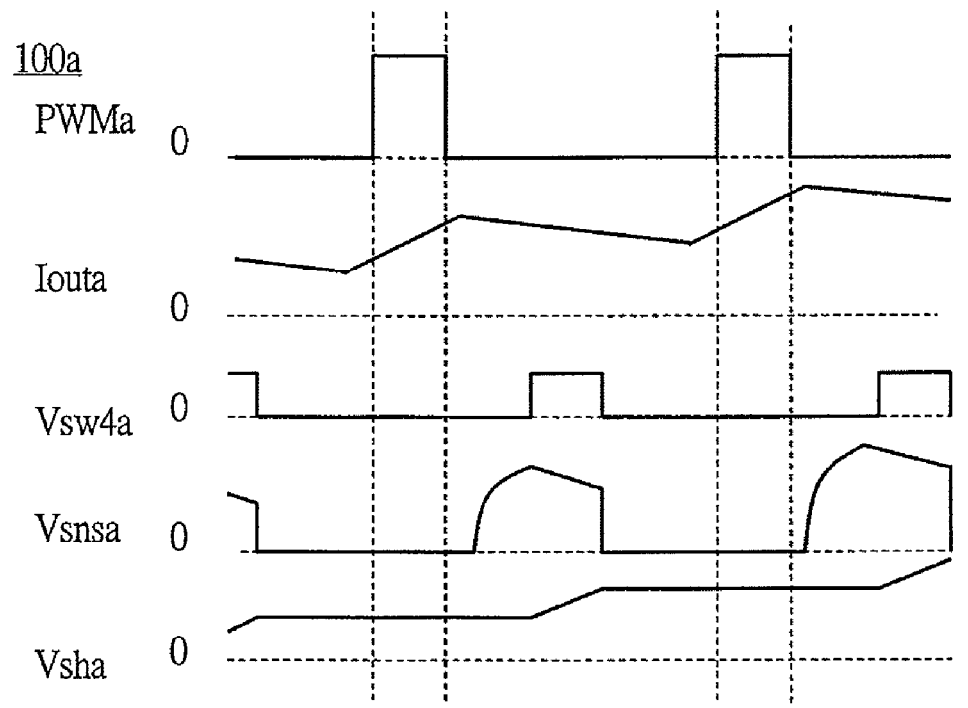
Figure 15:
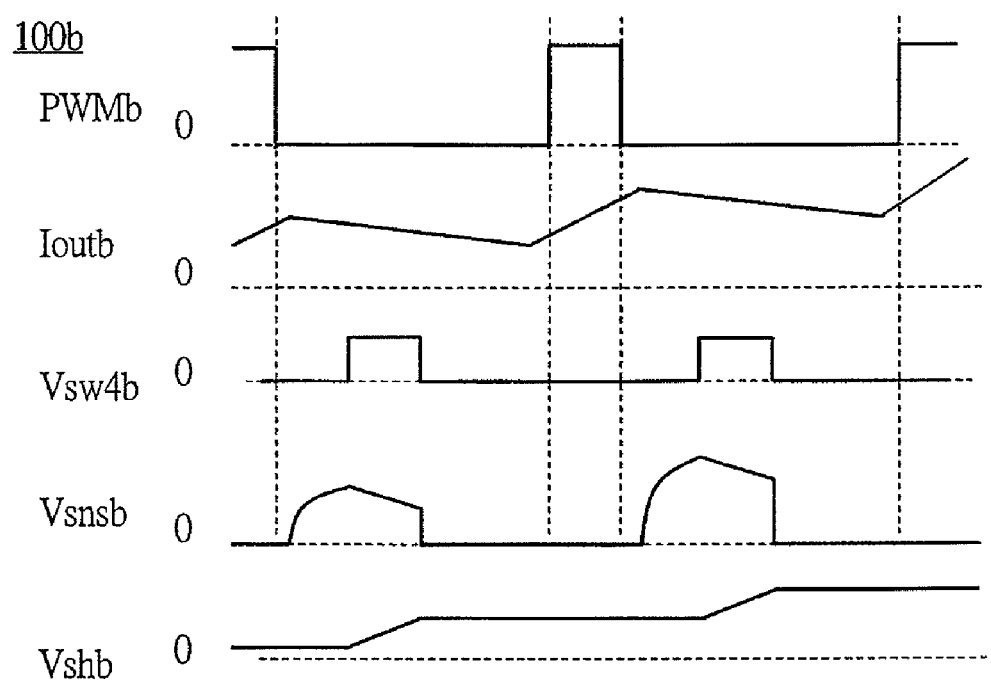

FIG. 14 is a circuit structural diagram showing a structural example of a switching power supply apparatus according to an eighth preferred embodiment of the present invention; and FIG. 15 is a timing chart showing changes of respective elements, or node potential and current, in main part of the switching power supply apparatus according to the eighth preferred embodiment of the present invention.

DESCRIPTIONS OF THE PREFERRED EMBODIMENTS

Preferred embodiments according to the present invention are illustrated in more details with reference to the attached drawings hereinafter. Meanwhile, in all the drawings for explaining the preferred embodiments, in principle an identical reference number is allotted to same components, and repeated explanations thereof are omitted.

First Embodiment

With reference to FIGS. 1-4, an example of a switching power supply apparatus according to a first preferred embodiment of the present invention is explained hereinafter.

Figure 1:
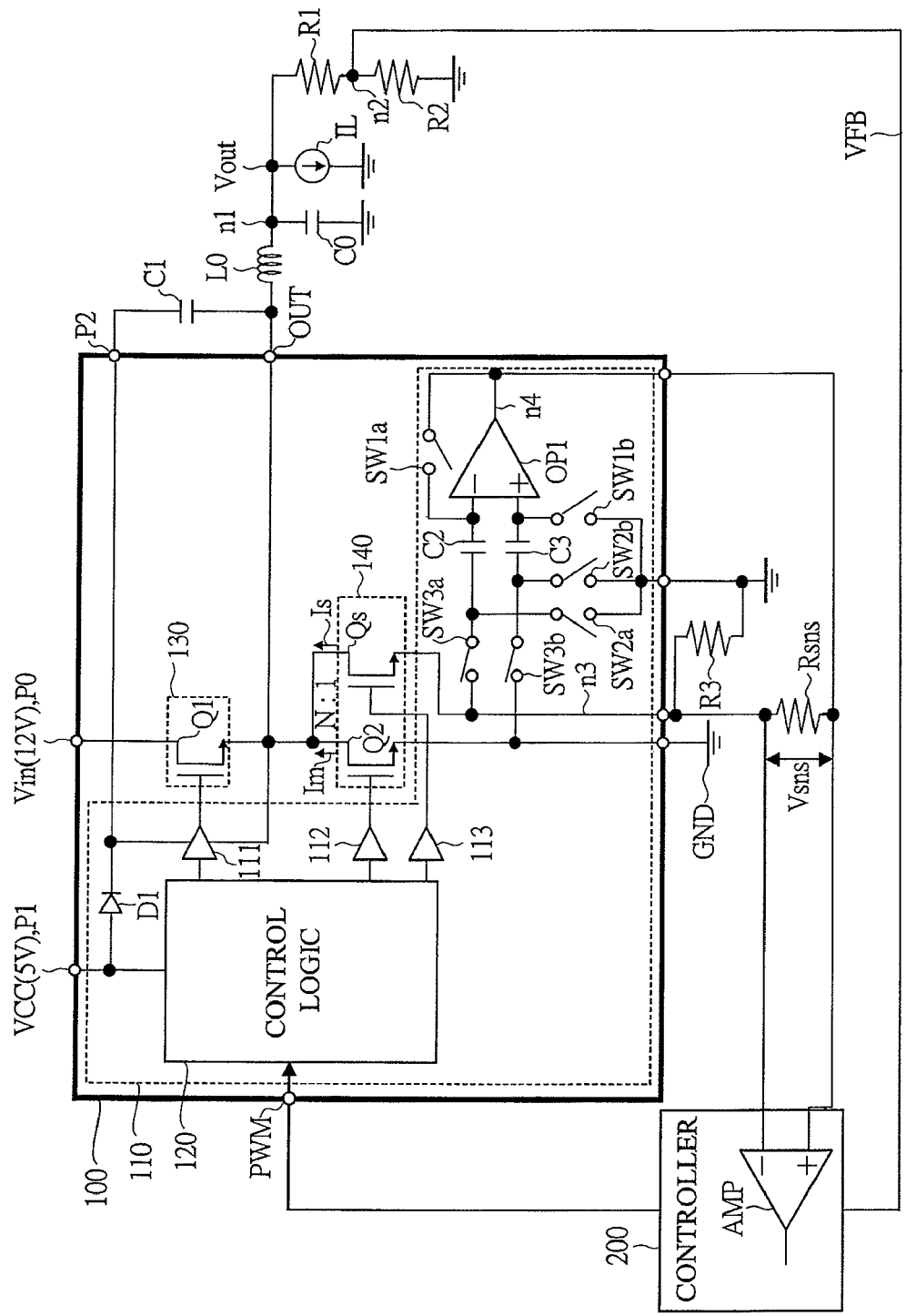
FIG. 1 is a circuit structural diagram showing a structural example of a switching power supply apparatus according to a first preferred embodiment of the present invention.

FIG. 1 is a circuit structural diagram showing a structural example of a switching power supply apparatus according to the first preferred embodiment.

The switching power supply apparatus according to the first preferred embodiment is to be applied to, for example, a power supply driver module incorporating a power supply driver circuit and a step down type switching regulator to which the same is applied, and incorporates a power supply driver module 100 that has a pair of power MOS transistors Q1 (hereinafter, high side power MOS transistor), and Q2 (hereinafter, low side power MOS transistor) connected in series between a voltage input terminal P0 to which DC voltage Vin (for example 12V) supplied from a DC power supply such as a battery or the like is input and a ground point (GND), and a driver IC 110 that drives the gate terminals of these power MOS transistors, and the like.

The driver IC 110 is structured of a gate drive circuit 111 that generates gate drive voltage of the high side power MOS transistor Q1, a gate drive circuit 112 that generates gate drive voltage of the low side power MOS transistor Q2, a control logic 120 that generates input signals of the gate drive circuits 111, 112 so that the power MOS transistors Q1 and Q2 should have dead time not so as to become ON state at the same time and for penetration current to flow, and should be turned ON/OFF in a complementary style, on the basis of PWM control pulse PWM from a controller 200, and the like. In this driver IC 110, the power MOS transistor Q1 is structured as a high side IC 130, and the power MOS transistor Q2 and a current sensing MOS transistor Qs to be described later herein are structured as a low side IC 140.

The peripheral circuit of the power supply driver module 100 is structured of a coil L0 as an inductor connected between the output terminal OUT of this power supply driver module 100 and a load, a smoothing capacitance C0 that is connected between a node n1 at the load side of this coil L0 and the ground point and stabilizes output voltage Vout, resisters R1 and R2 in series style for output voltage sensing connected in parallel with this smoothing capacitance C0, a controller (PWM control circuit) 200 that generates a PWM control pulse PWM on the basis of potential VFB of connection node n2 of the resisters R1 and R2 and supplies to the driver IC 110. In FIG. 1, what is shown as a current supply IL is a semiconductor integrated circuit as a load such as a CPU that operates by receiving current supplied from a switching regulator according to the present preferred embodiment.

In the present preferred embodiment, in the driver IC 110, an external power supply terminal P1 for applying power supply voltage VCC (for example 5V) is arranged, and between a gate drive circuit 111 that generates gate drive voltage of this external power supply terminal P1 and the high side power MOS transistor Q1 and this external power supply terminal P1, a diode D1 is connected, and an external terminal P2 connected to the cathode terminal (power supply terminal of the gate drive circuit 111) of this diode D1 is arranged, and between the external terminal P2 and the output terminal OUT of the power supply driver module 100, a capacitance element C1 is connected, thereby the diode D1 and the capacitance element C1 constitute a boot strap circuit for increasing the power supply voltage of the gate drive circuit 111.

In the switching regulator according to the present preferred embodiment, in the control logic 120 in the driver IC 110, on the basis of the PWM control pulse PWM supplied from the controller 200, the gate control signal to be input to the gate drive circuits 111 and 112 is generated. At this moment, if high level periods overlap due to uneven delay time of the gate control signal, penetration current flows into the power MOS transistors Q1, Q2, therefore in order to avoid this, in the control logic 120, the gate control signal to be input to the gate drive circuits 111 and 112 is so formed that the high level periods of the gate drive signals of the power MOS transistors Q1, Q2 should not overlap.

By the gate drive circuit 111 and 112, the high side power MOS transistor Q1 and the low side power MOS transistor Q2 are turned ON, OFF in complementary style according to the pulse width of the input PWM control pulse PWM, and thereby current flows to the coil L0, and voltage Vout corresponding to the duty ratio of the PWM control pulse is output.

Further, in the present preferred embodiment, as a current sensing circuit, a feedback loop is structured by use of a current sensing operational amplifier OP1 that operates with positive voltage so that voltage of the same potential as that of the source voltage of the power MOS transistor Q2 should be applied to a node n3 that connects a current sensing MOS transistor (hereinafter, referred to as sense transistor) Qs to which the low side power MOS transistor Q2 and the drain terminal are connected, and a current sensing resister (hereinafter, referred to as sense resister) Rsns connected to the source terminal of this current sensing MOS transistor Qs. Further, in this current sensing circuit, the structure is made so that the offset voltage of the current sensing operational amplifier OP1 should become always positive or negative, and, the potential at one end of the sense resister Rsns should become 1 mV or below cyclically.

In concrete, the current sensing circuit is structured of a sense MOS transistor Qs connected in parallel with the low side power MOS transistor Q2, and a gate drive circuit 113 that generates gate drive voltage of this sense MOS transistor Qs, a sense resister Rsns connected in series to the sense transistor Qs, a current sensing operational amplifier OP1 having an output terminal to which the other end of the sense resister Rsns are connected, offset cancel capacitors C2, C3, and changeover switches between nodes SW1a, SW2a, SW3a, SW1b, SW2b, SW3b and the like. For example, these changeover switches are made of an MOS transistor.

The changeover switch SW1a is connected between a connection node n4 of the sense resister Rsns and the current sensing operational amplifier OP1, and the inverting input terminal of the current sensing operational amplifier OP1. The offset cancel capacitor C2 is connected to the inverting input terminal of the current sensing operational amplifier OP1. The changeover switch SW2a is connected between the other end of the offset cancel capacitor C2 and the ground point GND. The changeover switch SW3a is connected between the connection node of the offset cancel capacitor C2 and the changeover switch SW2a, and the connection code n3 of the sense transistor Qs and the sense resister Rsns.

The changeover switch SW1b is connected between the non inverting input terminal of the current sensing operational amplifier OP1, and the ground point GND. The offset cancel capacitor C3 is connected to the non inverting input terminal of the current sensing operational amplifier OP1. The changeover switch SW2b is connected between the other end of the offset cancel capacitor C3, and the ground point GND. The changeover switch SW3b is connected between the source terminal of the power MOS transistor Q2, and the connection node of the offset cancel capacitor C3 and the changeover switch SW2b.

Then, the voltage of both the terminals of the sense resister Rsns is input to a differential amplifier AMP in the controller 200, and thereby the terminal to terminal voltage of the sense resister Rsns is detected.

Figure 2:
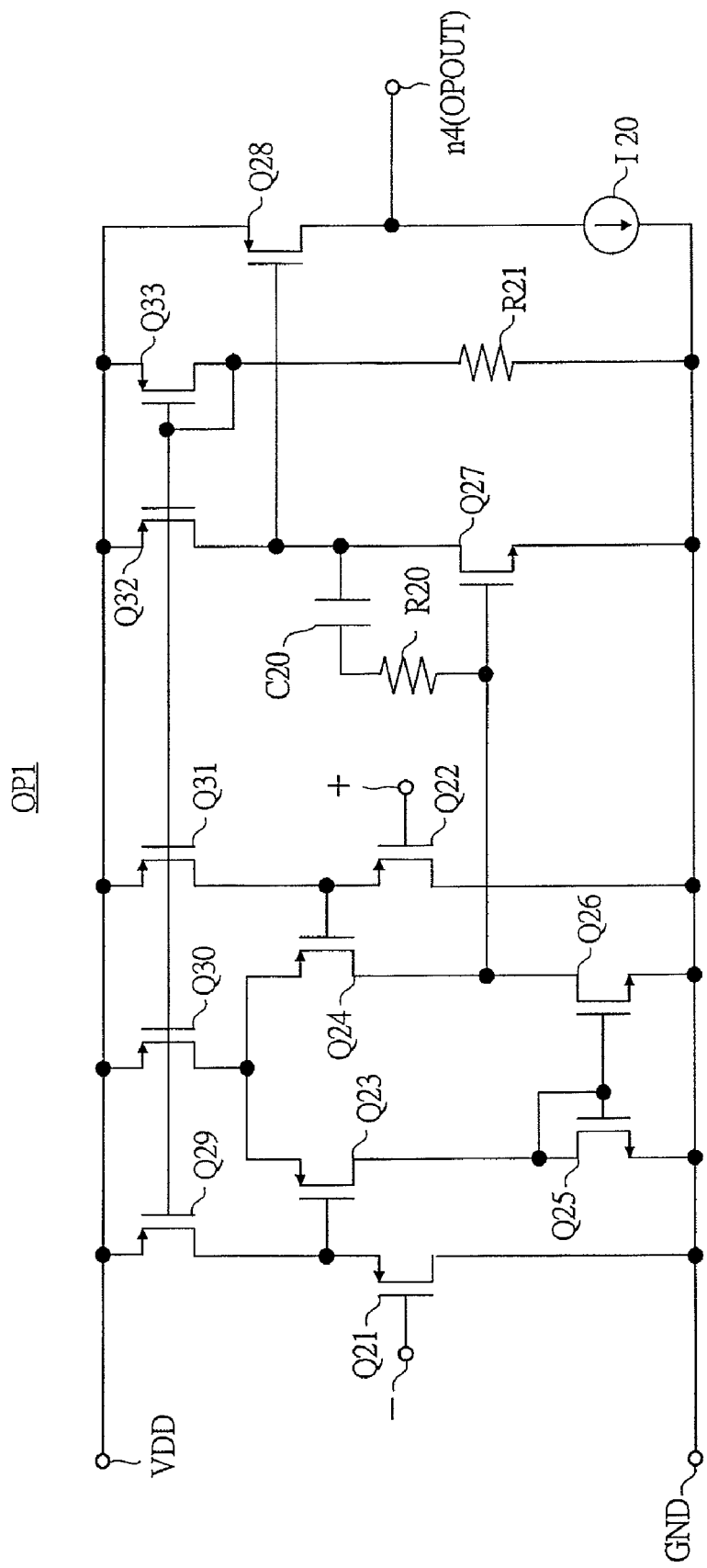
FIG. 2 is a circuit structural diagram showing a structural example of a current sensing operational amplifier, in the switching power supply apparatus according to the first preferred embodiment of the present invention.

FIG. 2 is a circuit structural diagram showing a structural example of a current sensing operational amplifier, in the present preferred embodiment.

For example, in the case where such a circuit as the present preferred embodiment is operated in a general single power supply operational amplifier, since the output potential of the operational amplifier is limited to 0 or higher, charging cannot be made to voltage of both the ends of the offset cancel capacitor C2 so that the node of the inverting input terminal of the current sensing operational amplifier OP1 should become negative potential. Further, negative potential is required to make the operational amplifier for both the power supplies, and accordingly the circuit scale becomes large.

Accordingly, in the present preferred embodiment, offset cancel method is realized by use of single power supply operational amplifier, and hereinafter, with reference to FIG. 2, a structural example of the current sensing operational amplifier OP1 for realizing this offset cancel method is explained.

The current sensing operational amplifier OP1 is structured of MOS transistors Q21-33, resisters R20, 21, a capacitor C20, a constant current source I20 and the like, and the constant current source I20 is arranged between the output terminal OPOUT of this current sensing operational amplifier OP1 and the ground point GND, and the MOS transistor Q28 is arranged between the output terminal OPOUT and the voltage VDD, and thereby a sense current source that functions also as level shift is arranged to output. Thereby, operations under operation conditions of preferable input/output characteristics can be realized. Further, the inverting input terminal of the current sensing operational amplifier OP1 is connected to the gate of the MOS transistor Q21, and the source of the MOS transistor Q21 is connected to the gate of the MOS transistor Q23 and the drain of the MOS transistor Q29, and thereby the inverting input terminal of the current sensing operational amplifier OP1 is level shifted.

In the same manner, the non inverting input terminal of the current sensing operational amplifier OP1 is connected to the gate of the MOS transistor Q22, and the source of the MOS transistor Q22 is connected to the gate of the MOS transistor Q24 and the drain of the MOS transistor Q30, and thereby the non inverting input terminal of the current sensing operational amplifier OP1 is level shifted. Thereby, it is possible to secure the operation margin of the current sensing operational amplifier OP1.

Further, in the present preferred embodiment, the size of the MOS transistor Q26 is set larger than the size of the MOS transistor Q25. Thereby, the operation balance of the current sensing operational amplifier OP1 is intentionally displaced, and to the voltage of both the ends of the offset cancel capacitor C2 connected to the inverting input terminal of the current sensing operational amplifier OP1, the node of the inverting input terminal of the current sensing operational amplifier OP1 becomes forcibly positive potential and the offset cancel becomes available, and thereby it is possible to cancel the offset voltage by the single power supply operational amplifier.

Figure 3:
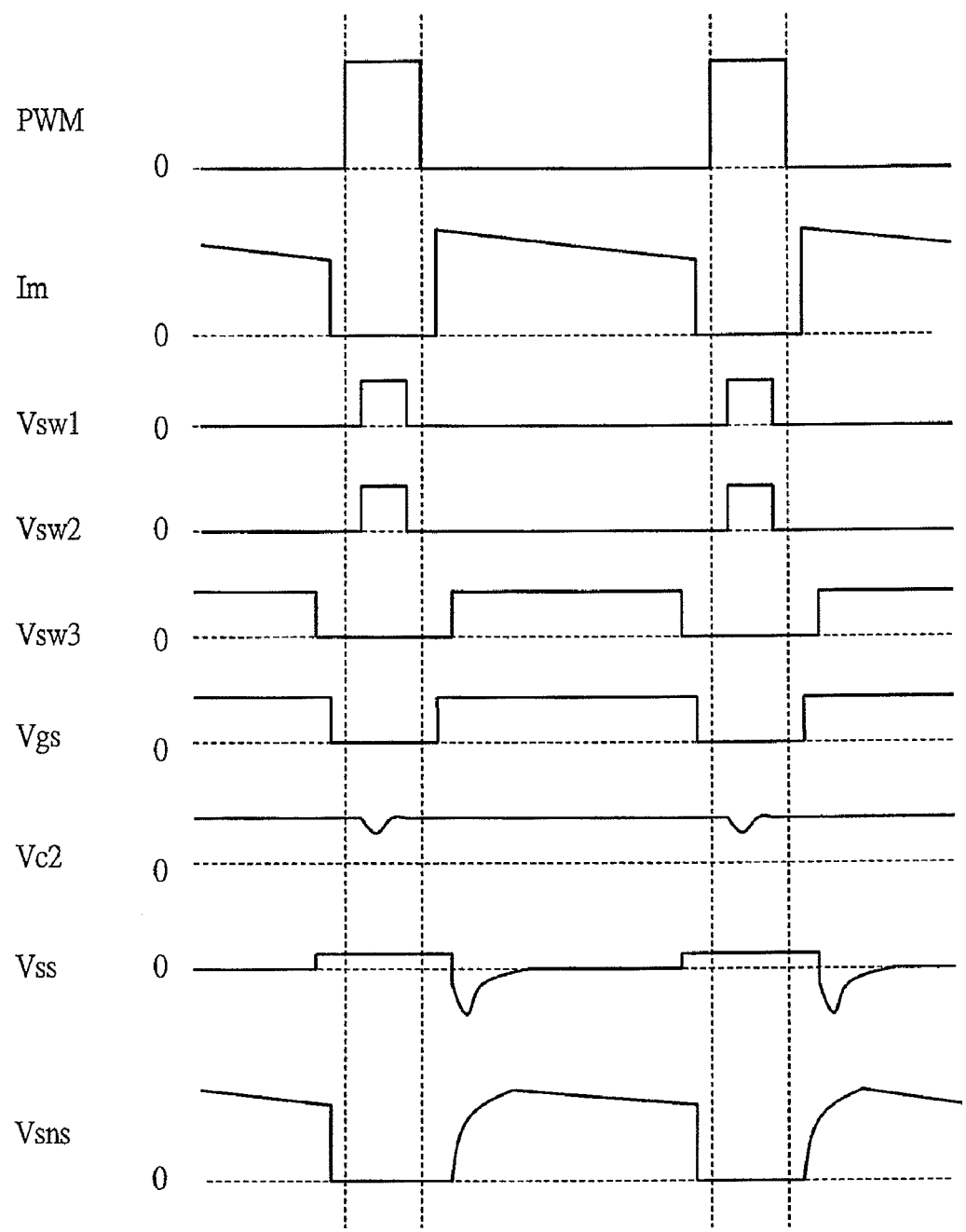
FIG. 3 is a timing chart showing changes of respective elements, or node potential and current, in the switching power supply apparatus according to the first preferred embodiment of the present invention.

FIG. 3 is a timing chart showing changes of respective elements, or node potential and current, in the present preferred embodiment.

On the basis of the PWM control pulse PWM supplied from the controller 200, ON, OFF action signals of the high side power MOS transistor Q1 and the low side power MOS transistor Q2 and the sense transistor Qs and the changeover switches SW1a, SW1b, SW2a, SW2b, SW3a, SW3b are generated. In sync with the gate signal of the high side power MOS transistor Q1, the changeover switches SW1*a*, SW1*b*, SW2*a*, SW2*b* get ON, and the switches become conductive. Further, the drive waveform of Vsw1 shows actions of the changeover switch SW1*a* and the changeover switch SW1*b*, and the drive waveform of Vsw2 shows the drive waveform of the changeover switch SW2*a* and the changeover switch SW2*b*.

In the state where the changeover switches SW1*a*, SW1*b*, SW2*a*, SW2*b* are ON, the offset voltage of the current sensing operational amplifier OP1 is charged to the offset cancel capacitor C2 of the inverting input terminal, and when the changeover switches SW3*a*, SW3*b* get ON, the electric charge charged to the offset cancel capacitor C2 is held and current sensing is made, and accordingly, the influence of offset is cancelled to the feedback system.

When the gate signal of the high side power MOS transistor Q1 and the gate signal of the low side power MOS transistor Q2 and the gate signal Vgs of the sense transistor Qs are switched to ON, OFF, both of Vsw1 and Vsw2 are turned OFF or either thereof is turned OFF, thereby switching current is made not to flow to the offset cancel capacitor C2 of the inverting input terminal, and precision is further improved.

Further, the drive waveform of Vsw3 shows actions of the changeover switch SW3*a* and the changeover switch SW3*b*. When the gate signal of the high side power MOS transistor Q1 and the gate signal of the low side power MOS transistor Q2 and the gate signal Vgs of the sense transistor Qs are switched to ON, OFF, Vsw3 is turned OFF, thereby switching current is made not to flow to the offset cancel capacitor C2 of the inverting input terminal, and precision is further improved.

When the switching regulator is operated as in the present preferred embodiment, in the state where the high side power MOS transistor Q1 is ON, the potential of the same size as the offset voltage of the current sensing operational amplifier OP1 is accumulated in the offset cancel capacitor C2 of the inverting input terminal of the current sensing operational amplifier OP1 in the direction to offset the offset voltage. And, in the state where the low side power MOS transistor Q2 is ON, the potential to offset the offset voltage is accumulated in the offset cancel capacitor C2, and the potential of the source terminal of the sense transistor Qs becomes the same potential as the potential applied to the source terminal of the low side power MOS transistor Q2 (ground potential GND in the case of the present embodiment), and accordingly, as shown in FIG. 3, the drain current Is flowing in the sense resister Rsns becomes proportional with the drain current Im flowing in the low side power MOS transistor Q2, and the voltage Vsns occurring in both the ends of the sense resister Rsns becomes proportional with Im.

Figure 4:
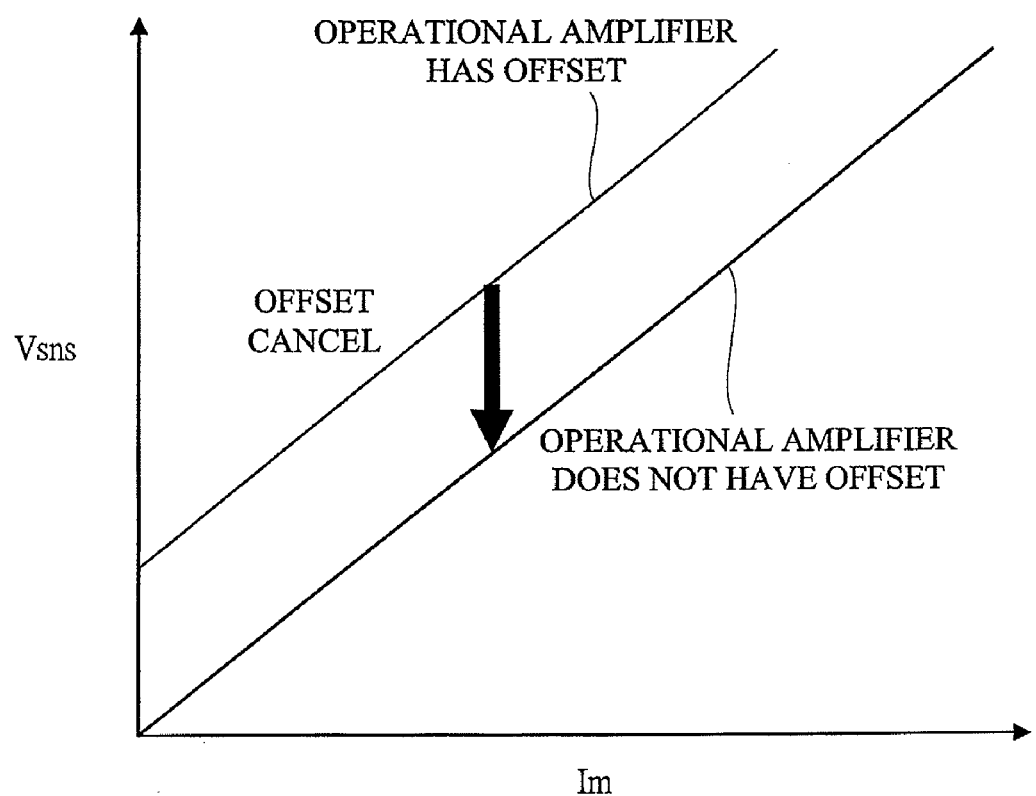
FIG. 4 is a figure showing the relation of Vsns to Im in the case where an operational amplifier has offset and in the case where it does not have, for explaining an increase in current

In the case where the offset voltage is offset and not cancelled as in the present preferred embodiment, as shown below, the voltage Vsns occurring in both the ends of the sense resister Rsns does not become proportional with the drain current Im flowing in the low side power MOS transistor Q2, and by the influence of the offset voltage Vos of the current sensing operational amplifier, a large measurement error occurs (FIG. 4).

$$Vsns=(Rm \times Rsns/Rs) \times Im + (Rsns/Rs) \times Vos$$

(Vsns:voltage of both the ends of sense resister, Im:drain current of low side power MOS transistor, Vos:offset voltage of current sensing operational amplifier, Rm:ON resister of low side power MOS transistor, Rs:ON resister of sense transistor, Rsns:sense resister)

Further, the low side power MOS transistor Q2 and the sense transistor Qs are formed on a same semiconductor chip by a same process so that the element sizes thereof (gate width or the number of elements) should become a specified ratio (N:1), and to the gate terminal of Qs, the same voltage as the gate drive voltage of Q2 is applied. As a result, the gate bias state of the low side power MOS transistor Q2 and that of the sense transistor Qs are made same, and to the sense transistor Qs, drain current Is (=Im/N) obtained by precisely proportionally contracting the drain current Im of the power MOS transistor Q2 to 1/N flows, and by use of a current sensing circuit according to the present preferred embodiment, it is possible to perform a highly precise detection.

Herein, when the terminal to terminal voltage of the sense resister Rsns is defined as Vsns, then, Vsns may be expressed by use of the drain current Im of Q2, the size ratio N of Q2 and Qs, and the resistance value Rsns of the sense resister Rsns, as below.

$$Vsns=Is \times Rsns=(Im/N) \times Rsns$$

Further, in the present preferred embodiment, in FIG. 1, the resister R3 arranged between the node n3 and the ground potential GND is arranged so as to suppress spike current at the moment of switching, and the response speed is improved by the resister R3. Meanwhile, as the resister R3, a diode having an appropriate value, an MOS transistor and the like may be employed.

Furthermore, in the present preferred embodiment, the method of detecting the drain current flowing in the low side power MOS transistor Q2 has been shown, meanwhile by use of the same method, it is possible to detect the current flowing in the high side power MOS transistor Q1.

Moreover, in the present preferred embodiment, an NMOS is employed in the high side power MOS transistor Q1, meanwhile, the present invention may be applied also to a switching power supply apparatus using a PMOS.

Second Embodiment

Figure 5:
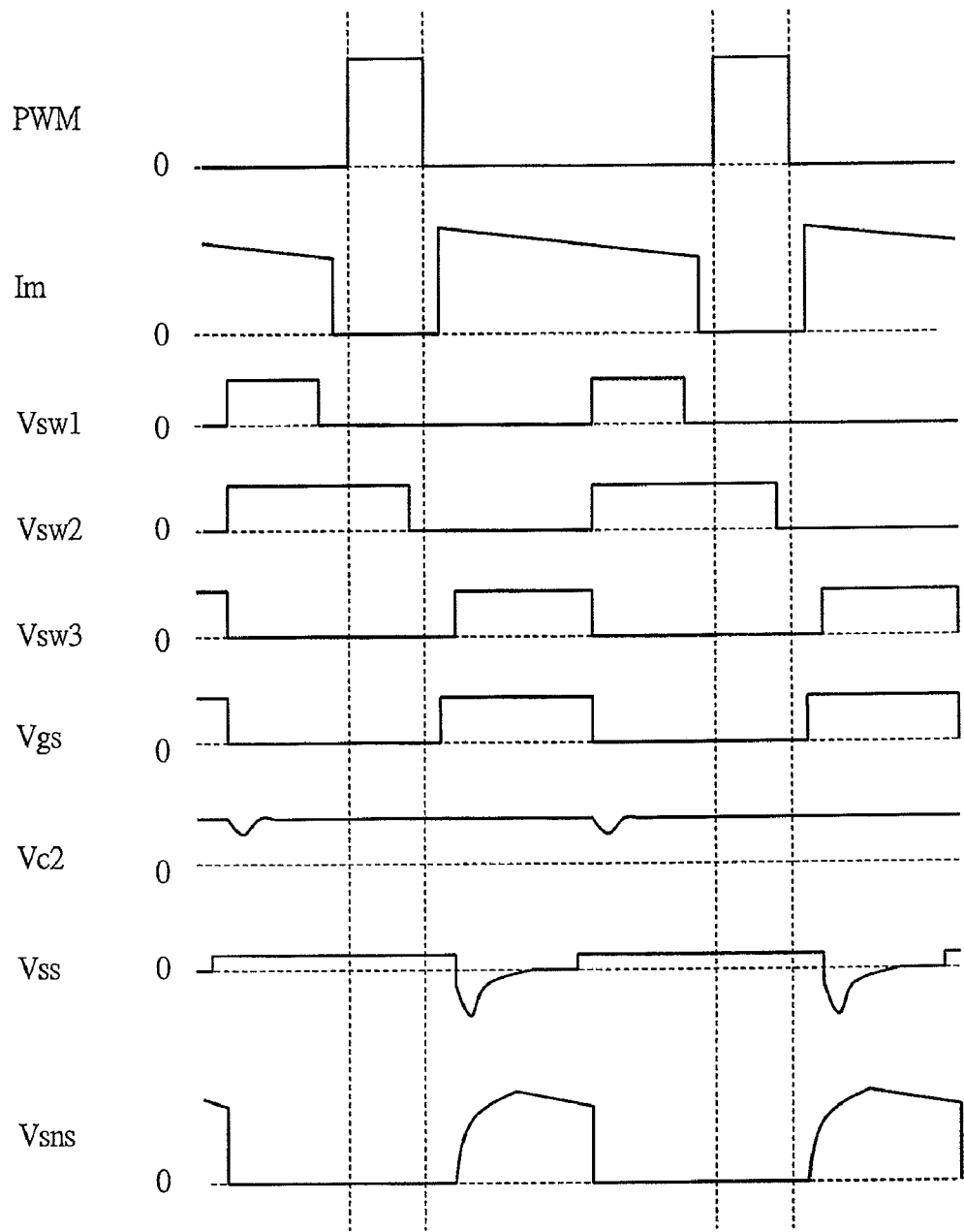
FIG. 5 is a timing chart showing changes of respective elements, or node potential and current, in the switching power supply apparatus according to a second preferred embodiment of the present invention.

With reference to FIG. 5, an example of a switching power supply apparatus according to a second preferred embodiment of the present invention is explained hereinafter. Meanwhile, the structure of the switching power supply apparatus according to the present preferred embodiment, the structure of the current sensing operational amplifier are same as those in the first preferred embodiment (FIGS. 1 and 2), therefore explanations thereof are omitted herein.

FIG. 5 is a timing chart showing changes of respective elements, or node potential and current, in a switching power supply apparatus according to present preferred embodiment.

In the switching power supply apparatus according to present preferred embodiment, in a case where operated at the timing in the first preferred embodiment (FIG. 3), when the time for which the high side power MOS transistor Q1 is in its ON state is very short, if the time enough for potential of the same size as the offset voltage of the current sensing operational amplifier OP1 cannot be accumulated in the offset cancel capacitor C2 of the inverting input terminal when the high side power MOS transistor Q1 is in its ON state, the timing for sampling the offset voltage is changed, and the timing is set so that the potential of the same size as the offset voltage of the current sensing operational amplifier OP1 should be accumulated in the offset cancel capacitor C2 when the low side power MOS transistor Q2 is in its ON state.

Thereby, even in a power supply driver module having a power supply driver circuit whose ON period is short and a step-down type switching regulator to which the same is applied, it is possible to cancel the offset voltage, and perform a highly precise detection.

Further, the present preferred embodiment is set so that the potential of the same size as the offset voltage of the current sensing operational amplifier OP1 should be accumulated in the offset cancel capacitor C2 of the non inverting input terminal when the low side power MOS transistor Q2 is in its ON state, meanwhile, when the current flowing in the high side power MOS transistor Q1 is detected by this method, if the ON state of the high side power MOS transistor Q1 is sufficiently larger than the ON state of the low side power MOS transistor Q2, and the charge time of the offset cancel capacitor C2 is not in time when the low side power MOS transistor Q2 is in its ON state, setting is made so that the potential of the same size as the offset voltage of the current sensing operational amplifier OP1 should be accumulated in the offset cancel capacitor C2 when the high side power MOS transistor Q1 is in its ON state, thereby it is possible to perform a highly precise detection in the same manner.

Third Embodiment

Figure 6:
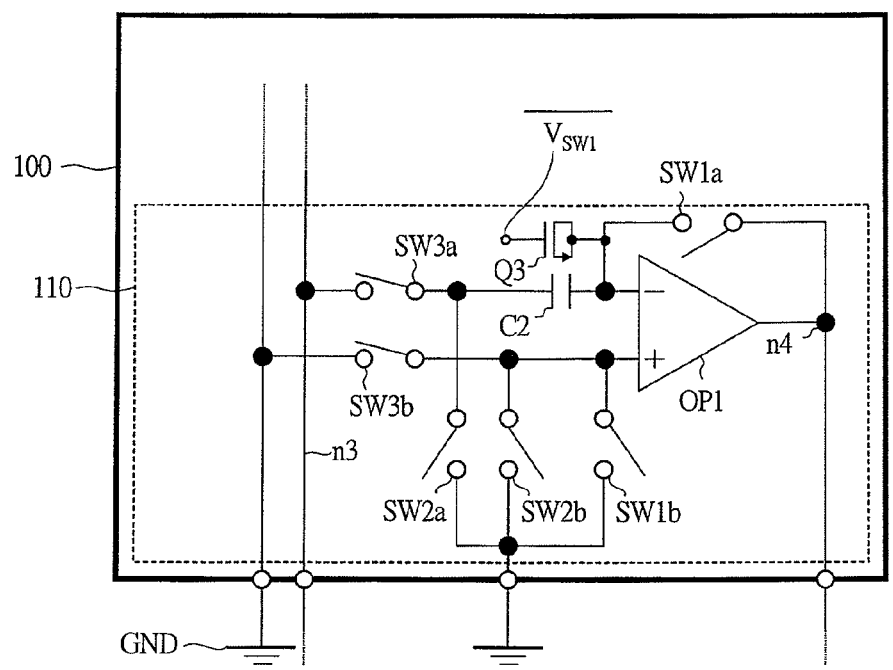
FIG. 6 is a circuit structural diagram showing a structural example of main part of a switching power supply apparatus according to a third preferred embodiment of the present invention.

With reference to FIG. 6, an example of a switching power supply apparatus according to a third preferred embodiment of the present invention is explained hereinafter.

FIG. 6 is a circuit structural diagram showing a structural example of main part of a switching power supply apparatus according to the present preferred embodiment.

The switching power supply apparatus according to the present preferred embodiment has a shortcircuited structure, where a source terminal and a drain terminal of an auxiliary MOS transistor Q3 of roughly half the size of the MOS used in the changeover switch SW1a of the inverting input terminal of the current sensing operational amplifier OP1 in FIG. 1 of the first preferred embodiment are connected, and the inverting signal of the changeover switch SW1a is connected to the gate drive signal of the auxiliary MOS transistor Q3, and the offset cancel capacitor C3 of the non inverting input terminal of the current sensing operational amplifier OP1 is removed.

Thereby, the auxiliary MOS transistor Q3 operates at the reverse phase of the changeover switch SW1a, and thereby the auxiliary MOS transistor Q3 receives the electric charge flowing out when the changeover switch SW1a operates, it is possible to offset the electric charge by switching flowing in the offset cancel capacitor C2 of the inverting input terminal of the current sensing operational amplifier OP1, and the offset cancel capacitor C3 is not required.

Fourth Embodiment

Figure 7:
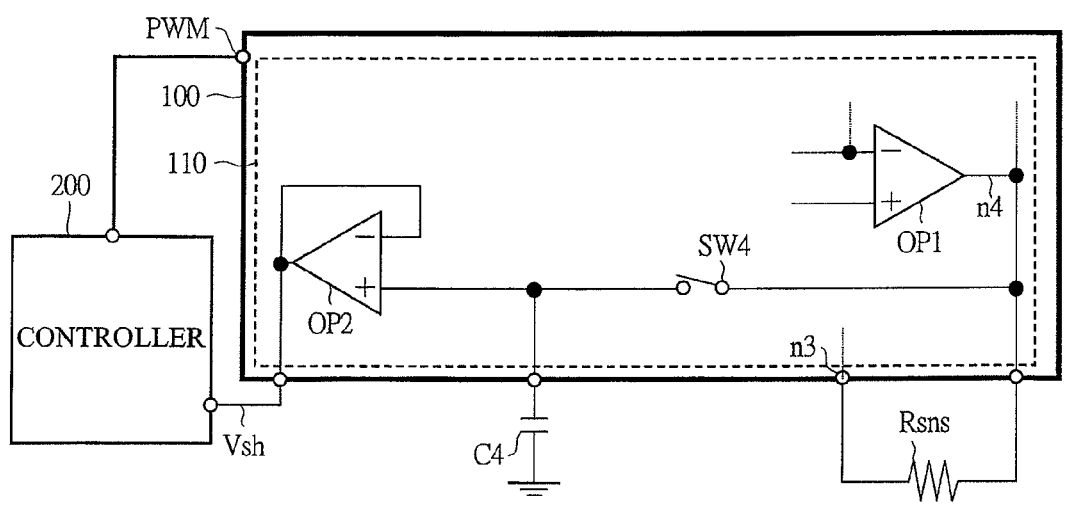
FIG. 7 is a circuit structural diagram showing a structural example of main part of a switching power supply apparatus according to a fourth preferred embodiment of the present invention.
Figure 8:
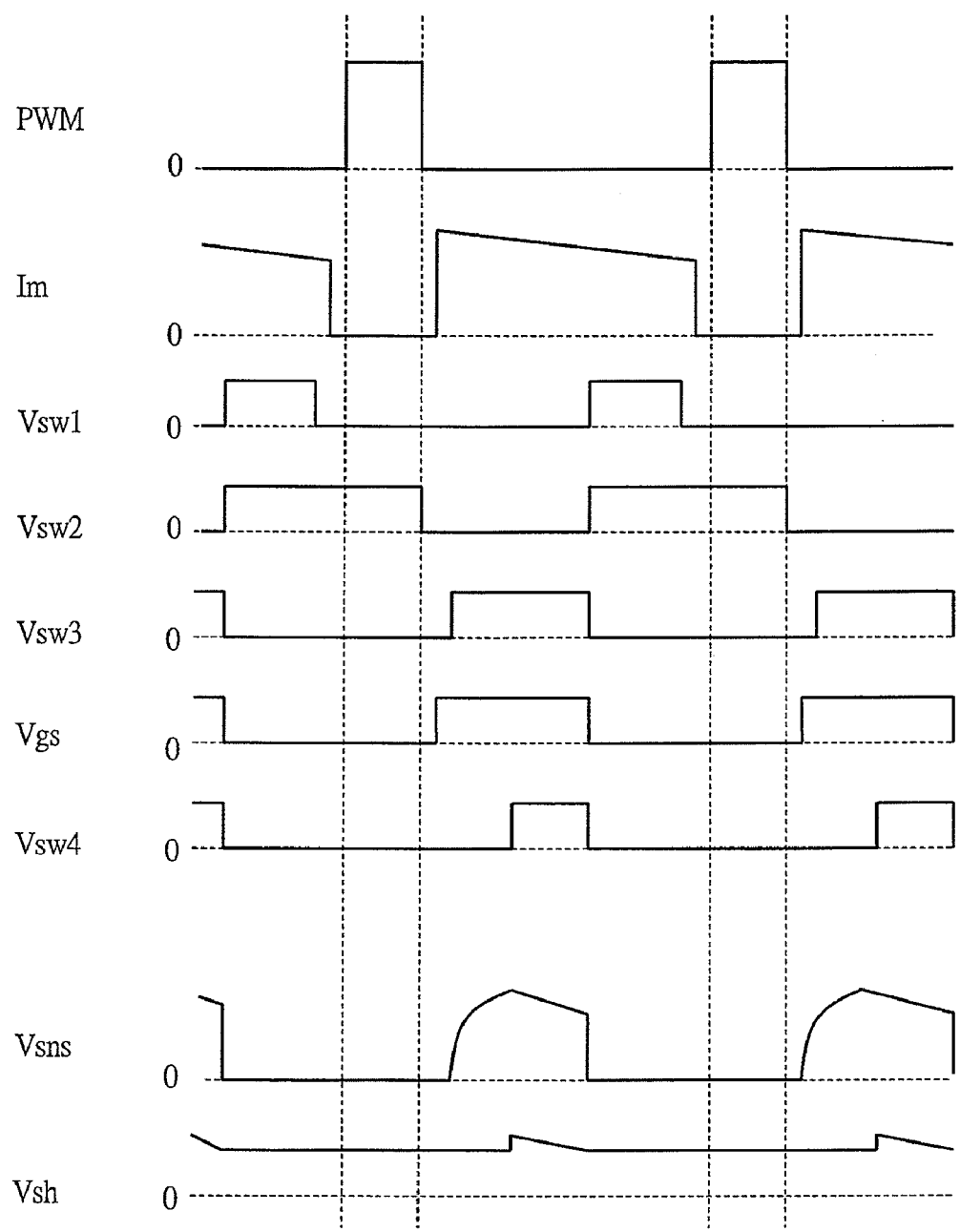
FIG. 8 is a timing chart showing changes of respective elements, or node potential and current, in the switching power supply apparatus according to the fourth preferred embodiment of the present invention.

With reference to FIG. 7 and FIG. 8, an example of a switching power supply apparatus according to a fourth preferred embodiment of the present invention is explained hereinafter.

FIG. 7 is a circuit structural diagram showing a structural example of main part of a switching power supply apparatus according to the present preferred embodiment, further, FIG. 8 is a timing chart showing changes of respective elements, or node potential and current.

In the switching power supply apparatus according to present preferred embodiment, the output terminal of the current sensing operational amplifier OP1 in FIG. 1 of the first preferred embodiment is connected to the terminal at one side of a DC output switch SW4, and the terminal at the other side is connected to the terminal at one side of a DC output hold capacitor C4 and the non inverting input terminal of the DC output operational amplifier OP2, and the terminal at the other side of the DC output hold capacitor C4 is grounded, and the inverting input terminal and the output terminal of the DC output operational amplifier OP2 and the current sensing terminal of the controller 200 are connected.

Thereby, after the low side power MOS transistor Q2 gets ON and until the center timing of the ON state period of the low side power MOS transistor Q2, the DC output switch SW4 is made in its ON state, and consequently it is possible to detect the voltage proportional to the average value of the drain current Im of the low side power MOS transistor Q2 to the DC output hold capacitor C4 as the DC output voltage Vsh to the DC output operational amplifier OP2.

However, in the present preferred embodiment, it is necessary to make large the size of the DC output switch SW4, and make the ON resistance small, electric charge flows out at every time when the switch SW4 is switched, and give influence to the potential of the DC output hold capacitor C4. In the case when the influence is large, the following fifth preferred embodiment is effective.

Fifth Embodiment

Figure 9:
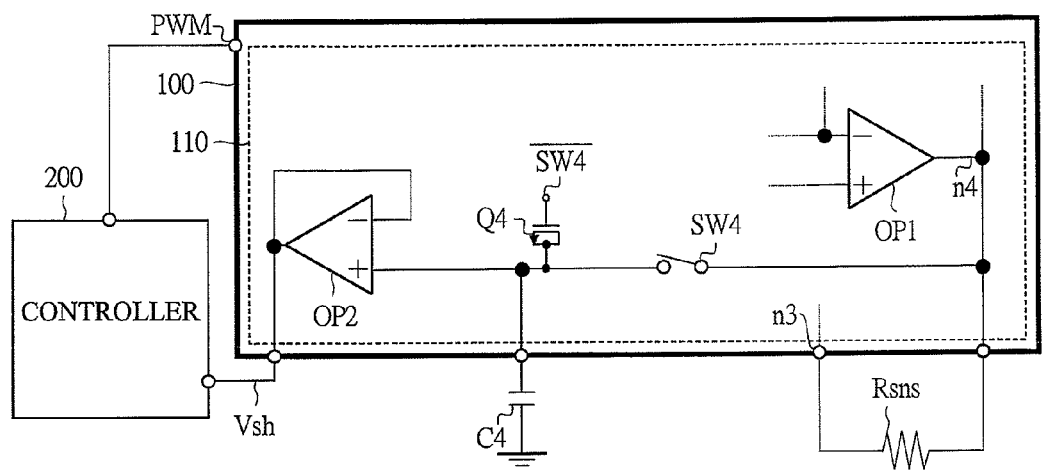
FIG. 9 is a circuit structural diagram showing a structural example of main part of a switching power supply apparatus according to a fifth preferred embodiment of the present invention.

With reference to FIG. 9, an example of a switching power supply apparatus according to a fifth preferred embodiment of the present invention is explained hereinafter.

FIG. 9 is a circuit structural diagram showing a structural example of main part of a switching power supply apparatus according to the present preferred embodiment.

In the switching power supply apparatus according to present preferred embodiment, to the connection node of the DC output hold capacitor C4 and the non inverting input terminal of the DC output operational amplifier OP2 in FIG. 7 of the fourth preferred embodiment, the source terminal and the drain terminal of the switching voltage compensation MOS transistor Q4 are connected.

Thereby, the electric charge flowing out at the moment when the DC output switch SW4 is switched is offset by the switching voltage compensation MOS transistor Q4, and it is possible to offset the influence by switching of the switch SW4, and perform a preferably precise detection.

However, in the present preferred embodiment, when the ripple current of the drain current Im of the low side power MOS transistor Q2 is large, in the case where the DC output switch SW4 is in its ON state, ripple voltage of the same shape puts on the DC output voltage Vsh, therefore, in the case of use in a power supply driver module whose ripple current is large and a step down type switching regulator to which the same is applied, the following sixth preferred embodiment is effective.

Sixth Embodiment

Figure 10:
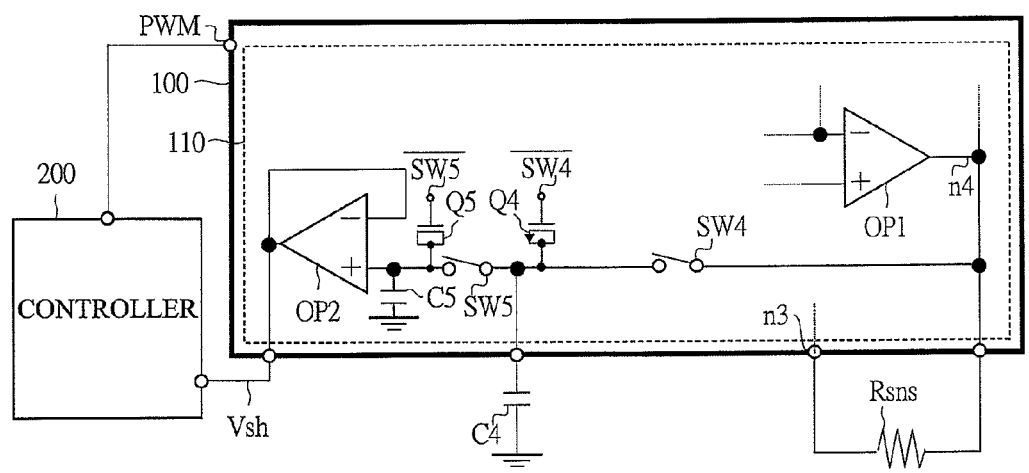
FIG. 10 is a circuit structural diagram showing a structural example of main part of a switching power supply apparatus according to a sixth preferred embodiment of the present invention.
Figure 11:
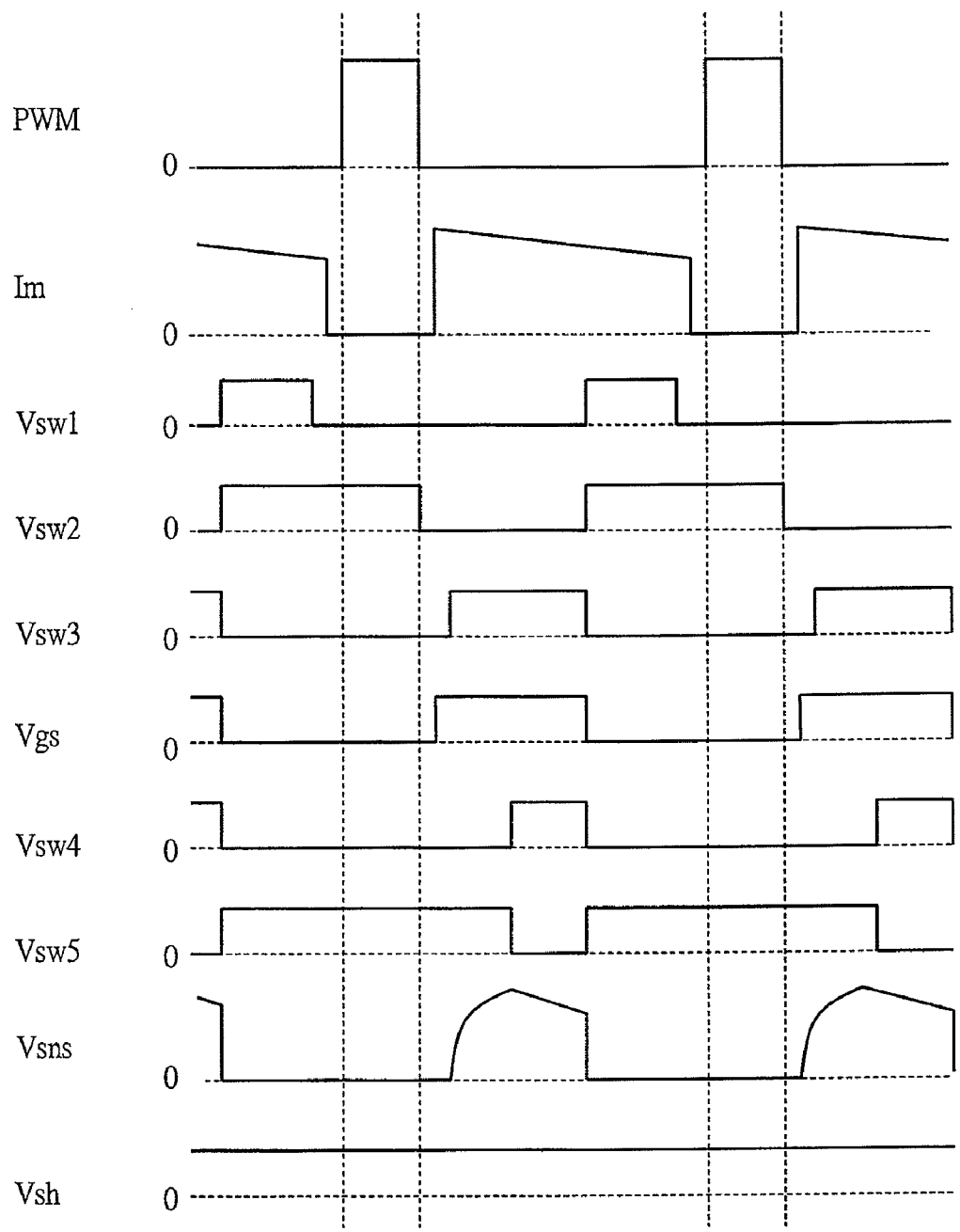
FIG. 11 is a timing chart showing changes of respective elements, or node potential and current, in the switching power supply apparatus according to the sixth preferred embodiment of the present invention.

With reference to FIG. 10 and FIG. 11, an example of a switching power supply apparatus according to a sixth preferred embodiment of the present invention is explained hereinafter.

FIG. 10 is a circuit structural diagram showing a structural example of main part of a switching power supply apparatus according to the present preferred embodiment, further, FIG. 11 is a timing chart showing changes of respective elements, or node potential and current.

In the switching power supply apparatus according to present preferred embodiment, between the terminal at one side of the DC output switch SW4 in FIG. 9 of the fifth preferred embodiment and the non inverting input terminal of the DC output operational amplifier OP2, a DC output auxiliary switch SW5 is arranged, and to the connection node of the DC output auxiliary switch SW5 and the non inverting input terminal of the DC output operational amplifier OP2, the terminal of the one side of the DC output auxiliary hold capacitor C5 is connected, and the terminal at the other side thereof is connected to the ground point, further, to the connection node of the switch SW5 and the terminal of the operational amplifier OP2, the source terminal and the drain terminal of the switching voltage compensation MOS transistor Q5 are connected.

Thereby, it is possible to always detect the average value of the drain current Im of the low side power MOS transistor Q2, without influence of ripple of the drain current Im of the low side power MOS transistor Q2 upon the DC output voltage Vsh while the DC output switch SW4 gets ON.

Seventh Embodiment

Figure 12:
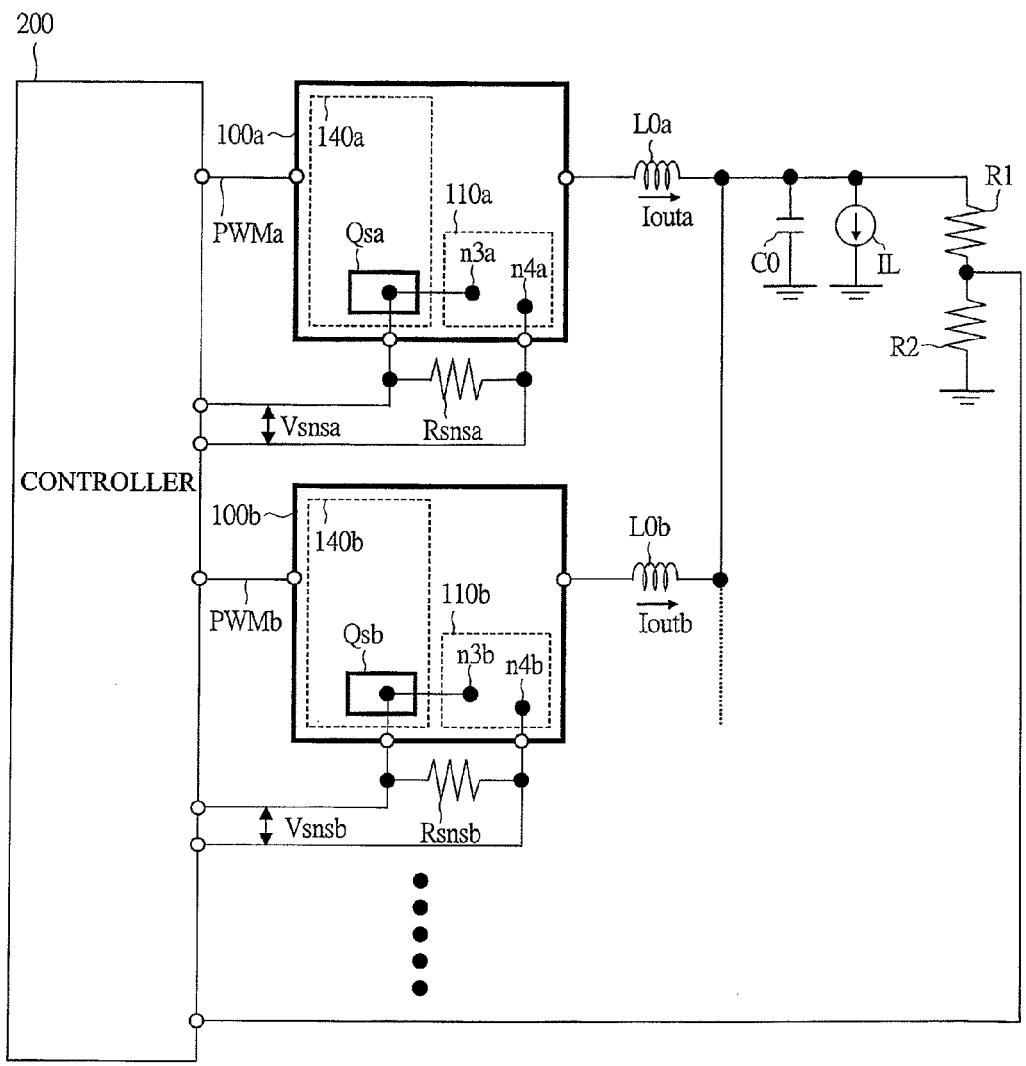
FIG. 12 is a circuit structural diagram showing a structural example of a switching power supply apparatus according to a seventh preferred embodiment of the present invention.
Figure 13:
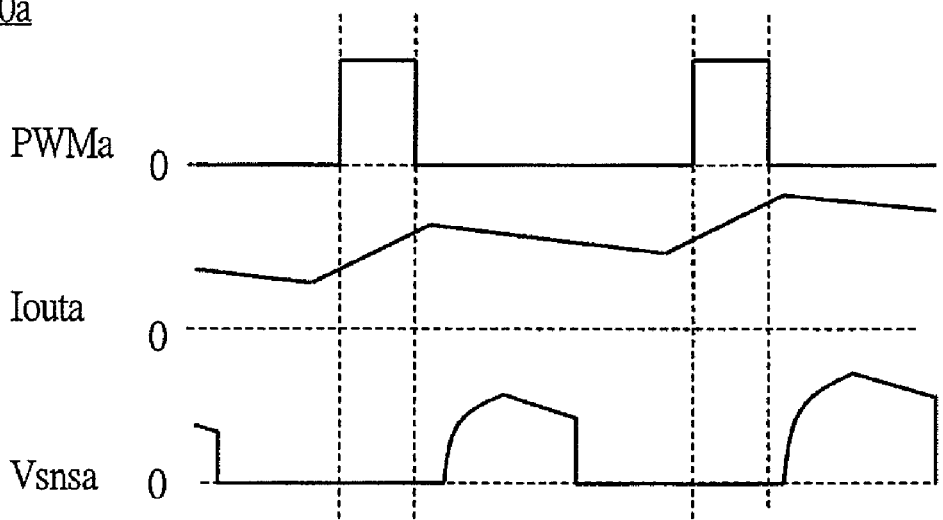
FIG. 13 is a timing chart showing changes of respective elements, or node potential and current, in main part of the switching power supply apparatus according to the seventh preferred embodiment of the present invention.
Figure 13:
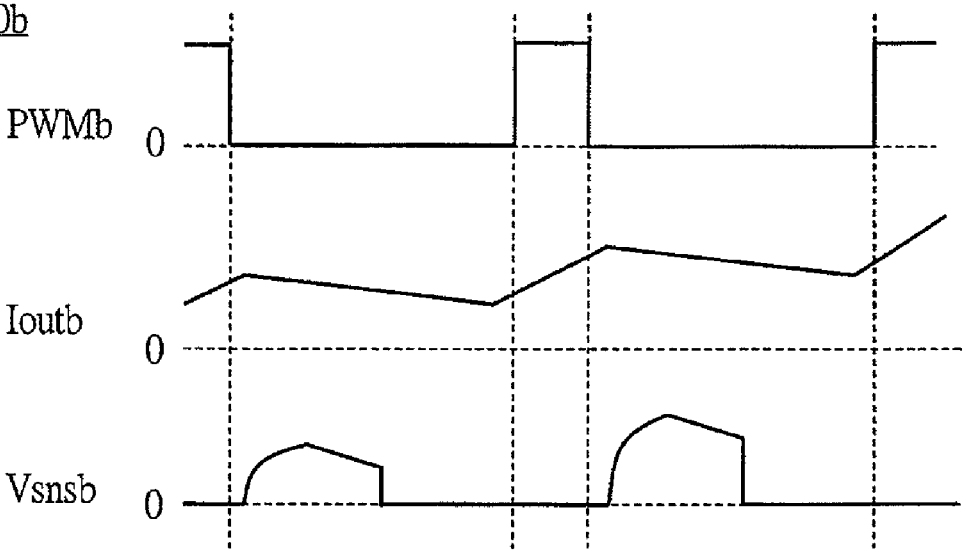

With reference to FIG. 12 and FIG. 13, an example of a switching power supply apparatus according to a seventh preferred embodiment of the present invention is explained hereinafter.

FIG. 12 is a circuit structural diagram showing a structural example of a switching power supply apparatus according to the present preferred embodiment, further, FIG. 13 is a timing chart showing changes of respective elements, or node potential and current in main parts.

The switching power supply apparatus according to present preferred embodiment is an example in the case where the step down type switching regulator according to the first—third preferred embodiments is used in multiple phases.

In the case when the present invention is used in a switching regulator that operates in multiple phases, a sense resister is required for each of plural switching regulators that are operated in parallel.

Therefore, in the switching regulator of the present preferred embodiment, terminals at one side of sense resisters Rsns (Rsnsa, RSnsb, . . . ) of respective power supply driver modules 100 (100a, 100b, . . . ) consisting of driver ICs 110 (110a, 110b, . . . ), low side ICs 140 (140a, 140b, . . . ) and the like connect the modes n4 (n4a, n4b, . . . ) of the output terminal of the current sensing operational amplifier OP1 of the driver ICs 110 and a controller 200, and nodes at the other side connect the source terminals of sense transistors Qs (Qsa, Qsb, . . . ) and changeover switches SW3a (nodes n3a, n3b, . . . ) of the driver ICs 110 and the controller 200.

Thereby, even in the case where plural switching regulators are operated in parallel, the same effects as those in the first—third preferred embodiments can be obtained.

Eighth Embodiment

With reference to FIG. 14 and FIG. 15, an example of a switching power supply apparatus according to an eighth preferred embodiment of the present invention is explained hereinafter.

FIG. 14 is a circuit structural diagram showing a structural example of a switching power supply apparatus according to the present preferred embodiment, further, FIG. 15 is a timing chart showing changes of respective elements, or node potential and current in main parts.

The switching power supply apparatus according to present preferred embodiment is an example in the case where the step down type switching regulator according to the fourth—sixth preferred embodiments is used in multiple phases, to the seventh preferred embodiment.

In the case when the present invention is used in a DC output switching regulator that operates in multiple phases, the terminal at one side of the sense resister Rsns of each power supply driver module 100 is connected to the node n4 of the output terminal of the current sensing operational amplifier OP1 of the driver IC 110, and the node at the other side is connected to the source terminal of the sense transistor Qs and the changeover switch SW3a of the driver IC 100. Further, the output terminal of the DC output operational amplifier OP2 in the driver IC 110 and the controller 200 are connected.

Thereby, even in the case where plural DC output switching regulators are operated in parallel, the same effects as those in the fourth—sixth preferred embodiments can be obtained.

Heretofore, the invention made by the present inventors has been explained in concrete with preferred embodiments, meanwhile, it is needless to mention that the present invention is not limited to the preferred embodiments described above, but the present invention may be embodied in other specific forms without departing from the spirit or essential characteristics thereof.

For example, in the above-mentioned preferred embodiments, in the power supply driver module, as the power MOS transistors Q1, Q2 and the current sensing MOS transistor Qs, MOSFET is employed, however, these transistors may be structured of a bipolar transistor and an IGBT and the like too.

Further, in the explanations of the preferred embodiments, the invention made by the present inventors has been explained with the step down type switching regulator to be used as a power supply apparatus for electronic devices in the field of the invention, however, the present invention may be applied widely to a step up type switching regulator and the like too.

The present invention is effective when applied to a current sensing circuit of a switching power supply apparatus that performs switching control and converts input voltage and obtains output voltage, and a power supply driver module incorporating the same, and a switching power supply apparatus using the module.

What is claimed is:

1. A switching power supply apparatus for performing a switching control of a power semiconductor element that flows current to an inductor and converting input voltage into specified output voltage, comprising a current sensing circuit wherein a feedback loop is structured by use of a single power supply operational amplifier that operates with positive voltage so that voltage of the same potential as that of source voltage or emitter voltage of the power semiconductor element should be applied to a node that connects a current sensing semiconductor element to which the power semiconductor element is connected with drain terminals thereof or collector terminals thereof, and a current sensing resister that is connected to source terminal or emitter terminal of the current sensing semiconductor element, wherein a first capacitor is arranged at the input terminal at one side of the single power supply operational amplifier, and current sensing signals are output on the basis of signals occurring in the current sensing resister.

2. The switching power supply apparatus according to claim 1, wherein a second capacitor is arranged at the input terminal at the other side of the single power supply operational amplifier.

3. The switching power supply apparatus according to claim 1, wherein offset voltage of the single power supply operational amplifier is sampled in sync with gate drive voltage or base drive voltage of the power semiconductor element.

4. The switching power supply apparatus according to claim 1, wherein offset voltage of the single power supply operational amplifier is sampled in a period of part of ON period of gate drive voltage or base drive voltage of the power semiconductor element.

5. The switching power supply apparatus according to claim 1, wherein the offset voltage of the single power supply operational amplifier always becomes positive or negative.

6. The switching power supply apparatus according to claim 2, wherein signals from the time point before the center timing of ON period of gate drive voltage or base drive voltage of the power semiconductor element to the time point of the center timing thereof are sampled by a third capacitor, and outputs as current sensing signals.

7. The switching power supply apparatus according to claim 1, wherein the terminal at one side of the current sensing resister is connected to the output terminal of the single power supply operational amplifier, and the terminal at the other side thereof is connected to the input terminal at one side of the single power supply operational amplifier and the source terminal or the emitter terminal of the current sensing semiconductor element.

8. The switching power supply apparatus according to claim 1, wherein a plurality of power supplies are operated in parallel with each other.

9. The switching power supply apparatus according to claim 1, wherein means for securing action margins of the single power supply operational amplifier is provided.

10. The switching power supply apparatus according to claim 1, wherein the potential at one end of the current sensing resister cyclically becomes 1 mV or below.

* * * * *